[11] Patent Number: 5,134,310
[45] Date of Patent: Jul. 28, 1992

[54] CURRENT SUPPLY CIRCUIT FOR DRIVING HIGH CAPACITANCE LOAD IN AN INTEGRATED CIRCUIT

[75] Inventors: Kenneth J. Mobley; S. Sheffield Eaton, Jr., both of Colorado Springs, Colo.

[73] Assignees: Ramtron Corporation, Colorado Springs, Colo.; NMB Semiconductor Co., Ltd., Japan

[21] Appl. No.: 644,903

[22] Filed: Jan. 23, 1991

[51] Int. Cl.$^5$ .............................................. H03K 3/013
[52] U.S. Cl. ............................... 307/270; 307/296.6; 307/296.8; 330/288
[58] Field of Search .................. 307/270, 296.6, 296.8; 330/288, 277; 323/315, 316

[56] References Cited

U.S. PATENT DOCUMENTS

| | | | |
|---|---|---|---|
| 3,629,692 | 12/1971 | Goyer | 307/296.6 |
| 3,828,241 | 8/1974 | Horichi | 307/296.6 |
| 3,835,410 | 9/1974 | Wittlinger | 330/288 |
| 4,037,120 | 7/1977 | Colardelle et al. | 307/296.6 |
| 4,081,696 | 3/1978 | Oda et al. | 307/296.6 |
| 4,338,527 | 7/1982 | Nagano | 307/296.6 |
| 4,381,484 | 4/1983 | Jarrett | 330/288 |
| 4,523,110 | 6/1985 | Johnson | 307/279 |
| 4,558,238 | 12/1985 | Yamada et al. | 307/296.6 |
| 4,591,804 | 5/1986 | Van Tuijl | 307/296.6 |
| 4,633,100 | 12/1986 | Van Tuijl | 330/288 |
| 4,766,333 | 8/1988 | Mobley | 330/253 |
| 4,814,724 | 3/1989 | Tanigawa | 330/288 |
| 4,855,618 | 8/1989 | Brokaw | 307/296.6 |
| 4,965,510 | 10/1990 | Kriedt et al. | 307/296.6 |
| 5,083,079 | 1/1992 | Plants | 307/296.8 |
| 5,084,633 | 1/1992 | Izadinia | 307/270 |

OTHER PUBLICATIONS

Microelectronics, Digital and Analog Circuit and Systems, McGraw-Hill Book Company, pp. 536-548.

Primary Examiner—Eugene R. LaRoche
Assistant Examiner—Tan Dinh
Attorney, Agent, or Firm—Edward D. Manzo

[57] ABSTRACT

A constant current power supply circuit for an integrated circuit memory which is well suited for driving a high capacitance load, such as a large number of sense amplifiers. A first circuit provides a constant current source and a second "current mirror" circuit provides an output current proportionate to the first circuit, but at a higher desired level of current. The constant current circuit is achieved using two cross-coupled FET transistors and two resistances such that the conductivity of each transistor is inversely related to the conductivity of the other. The circuit reaches a constant current equilibrium which is largely independent of operating voltage or load, but rather depends on the relative values of the components.

32 Claims, 1 Drawing Sheet

CURRENT SUPPLY CIRCUIT FOR DRIVING HIGH CAPACITANCE LOAD IN AN INTEGRATED CIRCUIT

BACKGROUND OF THE INVENTION

The present invention relates to integrated circuit memories and particularly to power supply circuits for driving a high capacitance load therein. For example, a dynamic random access memory ("DRAM") contains an array of memory cells which must be refreshed periodically because the storage mechanism involves placing charge on a capacitor plate, and the charge leaks away. Accordingly, each memory cell in the array is read and refreshed periodically to preserve the volatile data. To refresh a great number of memory cells at one instant, too much capacitance must be driven at once. This may overload the power supply and the interconnects carrying current. If a resistance is added between the memory cells and the power supply, the power supply will provide an exponentially decaying current, which is not acceptable.

It is an object of the present invention to provide a superior power supply for use in a memory or other integrated circuit which has an array of devices or other high capacitance load which requires the application of current periodically.

Another object of the present invention is to provide a power supply or MOS driver circuit for driving a high capacitance load wherein the current provided by the driver circuit rises with decreasing supply voltage or with increasing temperature over normal operating voltage and temperature ranges of the integrated ciruit.

Another object of the present invention is to provide a unique current source and unique current mirror operating in conjunction with that current source.

SUMMARY OF THE INVENTION

According to some aspects of the invention, a power supply circuit for driving a load, such as a plurality of sense amplifiers in an integrated circuit memory, comprises a constant current source coupled to receive a source of operating voltage such as $V_{cc}$ and a current mirror having an output to be coupled to the load. Preferably the constant current source comprises cross-coupled first and second transistors having first and second nodes, each node coupled to a respective control electrode of the first or second transistor. Illustratively field effect transistors are used. Preferably the first node, first transistor, and a first resistance are coupled to provide a path between a source of operating voltage and a reference potential, illustratively ground potential. The second node and second transistor are preferably coupled to provide a second path between the source of operating voltage and an output node. A second resistance may be provided in series between the operating voltage and the second transistor.

An improved current source may take the form of first and second paths as described above, but with a further transistor coupled between the source of operating voltage and the control electrode of the first transistor. Further, a resistance is added between the first transistor control electrode and the source-drain path of the transistor in the second path. Finally, the second path is between the load and the reference potential.

Preferably the current mirror provides a pair of transistors where one or both operate in the saturation region. Their gate electrodes preferably are coupled together. One transistor receives the output of the current source, and the other transistor provides the power supply output. Preferably the current through them is a function of the gate voltage.

An improved current mirror has also been invented. Two transistors are paired to have their gate electrodes coupled together, and two further transistors are similarly paired, with common gate electrodes. The output provides current proportional to the sizes (widths) of two paired transistors.

Though reference has been made to "gate" electrodes and while the embodiments herein employ field effect transistors ("FETs"), the present invention is not confined to such technology. Other transistors, e.g. bipolar, may be used.

BRIEF DESCRIPTION OF THE DRAWINGS

In describing the preferred embodiments, reference is made to accompanying drawings wherein.

DESCRIPTION OF A PREFERRED EMBODIMENT

Figure 1:
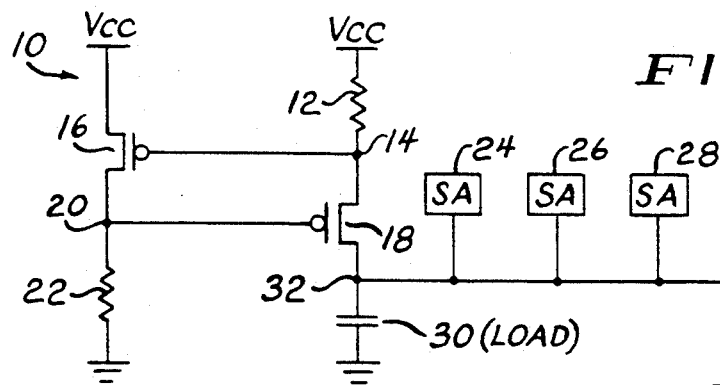
FIG. 1 shows a current source according to the present invention.

Turning initially to the schematic diagram of FIG. 1, a constant current source 10 using P-channel field effect transistors (FETs) is shown. Circuit 10 is preferably part of an integrated circuit memory having an array of memory cells and corresponding sense amplifiers. Current source 10 includes a first resistor 12 coupled between a source of operating voltage ($V_{cc}$) and a node 14. Node 14 is coupled to the gate electrode of a first transistor 16 and to the source of a second transistor 18. The gate electrode of transistor 18 is coupled via a further node 20 to the drain of first transistor 16. The source of transistor 16 is coupled to $V_{cc}$. Node 20 is coupled through a preferably large value resistor 22 to a reference potential (preferably ground), and the drain of transistor 18 is coupled to a load which may be a plurality of sense amplifiers 24, 26, 28, . . . . Capacitor 30 represents any high capacitance load which may be coupled between ground and the output node 32 at the drain of transistor 18, but is not necessary to the present invention.

At time $t_0$ when the circuit is initially turned on, the voltage at node 14 is $V_{cc}$. A P-channel transistor turns ON when its gate voltage is more than one threshold voltage ($V_t$) below the source voltage. Thus, transistor 16 is OFF since its source and gate are both at $V_{cc}$. Node 20 is at or near ground since it is coupled thereto via resistor 22. Transistor 18 turns ON as its gate is below $V_{cc}$ by more than $V_t$. Current will begin to flow from $V_{cc}$ through resistor 12.

When current flows through resistor 12, the voltage at node 14 drops in proportion to the current rise. Thus, the voltage at node 14 will be equal to $V_{cc}$ minus the resistance of resistor 12 multiplied by the current passing therethrough, per Ohm's Law.

At some time $t_1$, the voltage at node 14 declines to one $V_t$ below $V_{cc}$, whereupon transistor 16 turns ON (since its source is at $V_{cc}$ and its gate voltage is just one $V_t$ below $V_{cc}$). At this point, pull-up transistor 16 will couple $V_{cc}$ through its source-drain path to node 20. Since resistor 22 is preferably large in value, the voltage at node 20 rises. Indeed, the voltage at node 20 will rise quickly relative to the voltage at node 14, and thus the gate-to-source voltage of transistor 18 will decline, causing transistor 18 to conduct less and less.

An equilibrium occurs where the current through resistor 12 is such that the voltage at node 14 is $V_{cc}$ minus $V_t$, and the voltage at node 20 is stable somewhere between $V_{cc}$ and ground. If transistor 18 tries to pull more current through resistor 12, the voltage at node 14 drops lower, causing transistor ON harder. This causes the voltage at node 20 to go higher, which shuts down transistor 18 correspondingly. When this happens, the current through node 14 drops, and the voltage on node 14 is once again pulled toward $V_{cc}$ via resistor 12.

Conversely, if transistor 18 tries to pull less current through resistor 12, then the voltage at node 14 rises toward $V_{cc}$, transistor 16 will conduct less, causing the voltage at node 20 to drop (because resistor 22 is grounded). Because node 20 is coupled to the gate electrode of transistor 18, transistor 18 will now turn ON harder, tending to draw more current through node 14.

Thus, an equilibrium naturally occurs in the circuit of FIG. 1. It is noted that transistor 16 is large compared to the current through resistor 22. Transistor 16 and resistor 22 provide an amplification of the voltage of node 14. Transistor 18 must be large enough to drive the current load shown as sense amplifiers 24, 26, 28, and others (not shown) that are similarly driven or other loads. (Output) Node 32 coupling the drain of transistor 18 to the load provides an output which can be referred to as "LATCH P" and, for example, may be coupled via sense amplifiers to numerous bit lines.

Thus it will be understood that the circuit of FIG. 1 provides a constant current source which is fairly independent of the exact value of $V_{cc}$. However, the circuit is not independent of temperature. To provide compensation for temperature variations, one could use a different form of resistance than a "genuine" or "real" resistor 12, for example one which has a different coefficient of temperature. However, this is not advisable because the value of $V_t$ also varies, and the current through transistor 18 would be unpredictable. It is preferred, therefore, to compensate resistor 22 for temperature variations in another aspect of the invention.

Figure 2:
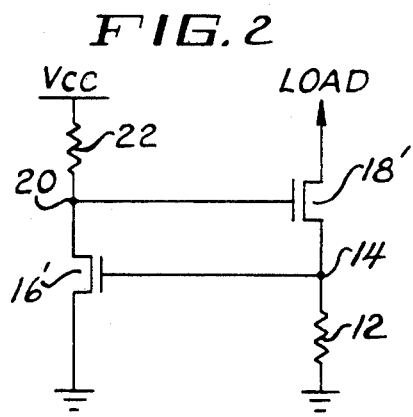
FIG. 2 shows a variation of the FIG. 1 circuit, but using N-channel transistors instead of P-channel transistors.

The circuit of FIG. 1 could also be drawn using N-channel transistors, as shown in FIG. 2. This Figure is essentially the same as FIG. 1 except that the N-channel transistors are marked 16' and 18' and the resistors 12 and 22 are transposed with their respective transistors 16, 18. The operating voltage is applied via resistor 22 to the drain of FET 16', the source of which is grounded. Node 20 between the drain of FET 16' and resistor 22 is coupled to the gate electrode of FET 18', whose drain provides the output to the load. The source of FET 18' is coupled via node 14 to resistor 12, which is also grounded. Node 14 is coupled to the gate electrode of FET 16'.

To drive a very large current, a small resistor 12 could be used in FIGS. 1 or 2. However, because using a small resistor 12 may be difficult to control, it is preferred to use a large value resistor 12, thus producing a smaller current, and then amplifying the current with a current mirror. Such a current mirror is depicted in FIG. 3, and preferably is part of the same integrated circuit as the current source.

Figure 3:
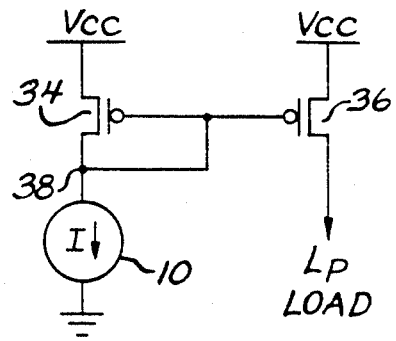
FIG. 3 shows a current mirror suitable for use in the present invention.

As shown in FIG. 3, a P-channel transistor 34 has its source-drain path coupled between $V_{cc}$ and the output node 32 of current source 10. Another P-channel transistor 36, which may be called an output transistor, has its source coupled to $V_{cc}$ and its drain coupled to provide the power supply output signal LATCH P. The gate electrodes of these transistors 34 and 36 are coupled together at a node 38. The size of transistor 34 is smaller than that of transistor 36. If the output voltage LATCH P (the drain of FET 36) is equal to or less than the voltage at node 38, then transistor 36 is in saturation. Thus, the current through transistor 36 is a function of its gate voltage relative to $V_{cc}$, and not a function of the drain voltage, LATCH P. Transistor 34 is in the saturation region since its gate voltage is equal to its drain voltage. Since both transistors are in saturation, the output current should be a function of the gate voltage. Since the gate voltages are equal, the current through transistor 36 is a multiple of the current through transistor 34, the multiple being related to the relative sizes of transistors 34 and 36.

A limitation of the circuit of FIG. 3 is that the voltage of LATCH P must be less than or equal to the voltage at node 38. This is significant because LATCH P must be driven to a relatively high voltage, illustratively to about 4.25 volts if $V_{cc}$ is equal to 4.5 volts. Because the voltage at node 38 is not a function of the voltage of LATCH P, the voltage at node 38 will be constant, and as LATCH P rises in voltage, transistor 36 will eventually drop out of saturation. Thus, the voltage at node 38 must be high also, which would require transistor 36 to be very big in order to supply a large current with such a small gate-to-source voltage.

Figure 4:
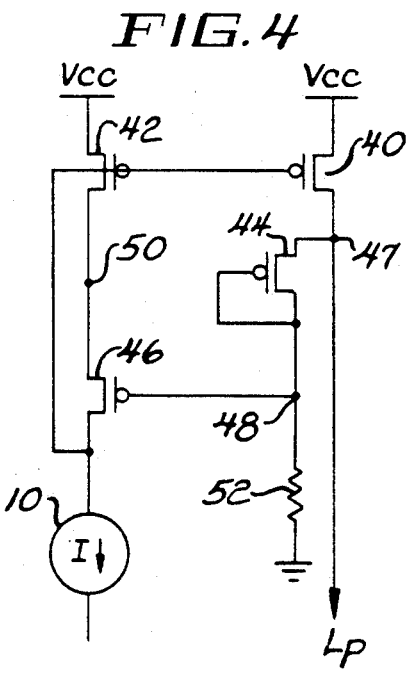
FIG. 4 shows an improved current mirror where one of the paired transistors need not operate in the saturation region for use in the present invention.

FIG. 4 illustrates an improved integrated circuit current mirror which allows the circuit to maintain constant current even when transistor 40 is not in saturation. It comprises P-channel transistors 40, 42, 44, and 46. Devices 40 and 42 have common gate electrodes as do devices 44, 46. Transistor 40 is the output transistor, having its source coupled to $V_{cc}$ and providing the output signal LATCH P at its drain. The source of transistor 42 is also coupled to $V_{cc}$, and its gate electrode, tied to the gate electrode of transistor 40, is coupled to the current output of constant current source 10.

Transistor 44 has its source electrode coupled to the drain of transistor 40, and this node 47 provides the output signal LATCH P. The gate electrode of FET 44 is tied to its drain at a node 48. Node 48 is also coupled to the gate electrode of transistor 46 having a source electrode that is coupled at a node 50 to the drain of transistor 42. The drain of transistor 46 is coupled to the current output of constant current source 10. A resistance 52 is coupled between node 48 and ground.

Transistor 40 is sized relative to transistor 42 by the multiplier of the current mirror. These devices do not have to be in saturation. Transistor 44 has its drain voltage equal to its gate voltage so the voltage at node 49 is always one $V_t$ below the voltage of LATCH P so long as resistor 52 has a large resistance compared to the current drive of 44. Transistor 46 is large compared to the current provided by current source 10, so the voltage at node 50 is equal to the voltage at node 48 plus one $V_t$ because transistor 46 is a source follower. This means that the voltage at node 50 is substantially equal to the voltage of LATCH P. Since transistors 40 and 42 have: (1) the same voltages at their gate electrodes, (2) the same source voltages, $V_{cc}$ and (3) essentially the same drain voltages (the voltage of LATCH P), then the currents are proportional to the sizes (widths) of transistors 40, 42.

Figure 5:
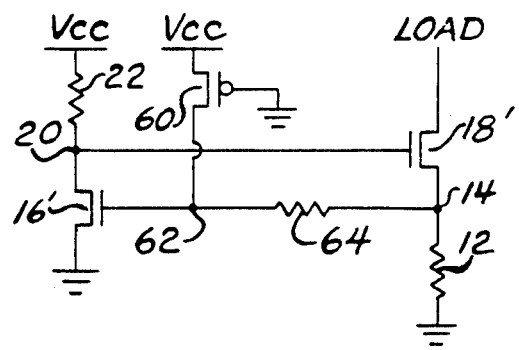
FIG. 5 shows a variation on the current source circuit of FIG. 2 to compensate for temperature and operating conditions.

FIG. 5 shows a temperature and voltage compensated constant current source. Like FIG. 2, it uses N-channel transistors 16' and 18'. It will be seen that FIG. 5 differs from FIG. 2 by the addition of what we may call a "compensation circuit" illustratively formed by a further P-channel transistor 60 having its source coupled to $V_{cc}$ and its drain coupled to a node 62. In addition, the compensation circuit comprises a further resistance 64 coupled between node 62 and node 14. Node 62 is also coupled to the gate electrode of N-channel transistor 16'. Transistor 60, for reasons that will shortly become evident, can be referred to as a "compensation transistor." The drain of N-channel transistor 18' is connected to the load (which may be the current mirror). In the constant current source of FIG. 5, node 62 tends to stay at $V_t$, and node 14 tends to be just below one $V_t$.

In the circuit of FIG. 5, current will flow from $V_{cc}$ through the source-drain path of compensation transistor 60 to node 62. That current will be forced through resistance 64, causing a decline in the voltage at node 14 with respect to node 62. Transistor 60 is relatively small, and supplies little current compared to transistor 18'. Thus, the voltage at node 14 will equal $V_t$ minus the product of the resistance 64 and the relatively small current through transistor 60.

When the temperature drops or the value of $V_{cc}$ rises, compensation transistor 60 naturally becomes more conductive and provides a higher current to node 62. Since the voltage at node 14 is inversely related in the manner explained above to that current, the voltage at node 14 will drop. As the voltage at node 14 drops, the current through resistor 12 must also drop due to Ohm's Law. This means that the current through transistor 18' also drops, because of Kirchoff's Law.

Thus, if $V_{cc}$ is high or the temperature is low, where more current would be expected, the constant current source actually drops its current. Accordingly, at high temperatures where field effect transistors are normally slowest, this circuit gives more current and speeds up the precharge while increasing the consumed power. On the other hand, at low temperatures, field effect transistors are faster and use more power. This circuit, however, slows down and uses less current. Thus, the speed and power specifications can remain relatively constant over a wide range of temperature.

Figure 6:
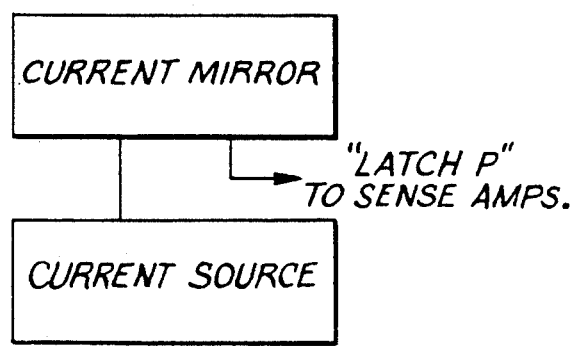
FIG. 6 shows how to combine the foregoing circuits according to another aspect of the present invention.

The general block diagram of FIG. 6 shows that a constant current source is combined with a current mirror to provide the power supply signal LATCH P which, for example, may be used for refreshing the memory cells in a DRAM. LATCH P may be coupled in parallel to a plurality of sense amplifiers.

It will be appreciated that the present disclosure is intended to be illustrative and that various modifications can be made within the scope and spirit of the present invention.

We claim:
1. In an integrated circuit, a circuit for driving a high capacitance load comprising:
   first and second voltage sources;
   a constant current source coupled to said first and second voltage sources and having an output node; and
   a current mirror coupled to said constant current source output node and having an output to be coupled to a load;
   wherein said constant current source comprises
   first and second transistors each having a path of controllable conductivity and a control electrode;
   first and second nodes each coupled to the control electrodes of said second and first transistors respectively;
   first and second resistances;
   said first node, first transistor, and first resistance being coupled between said first and second voltage sources;
   said second node, second transistor, and second resistance being coupled between one of said first and second voltage sources and said output node; and
   a compensation circuit comprising a third transistor and a third resistance, said third transistor having a path of controllable conductivity coupled between said control electrode of said first transistor and one of said first and second voltage sources, said third resistances being coupled between said second node and said control electrode of said first transistor, so that increased conduction of said third transistor forces said second transistor to supply less current to said output node.

2. The circuit of claim 1 wherein said third transistor has a control electrode coupled to one of said voltage sources.

3. The circuit of claim 2 wherein said third transistor has a control electrode coupled to said reference voltage.

4. The circuit of claim 2 wherein said first voltage source comprises a source of operating voltage.

5. The circuit of claim 2 wherein said second voltage source comprises a source of a reference voltage.

6. The circuit of claim 1 wherein said current mirror comprises:
   fourth and fifth transistors each having a control electrode and a path of controllable conductivity, said fourth transistor being coupled between said current source and said first voltage source, said fifth transistor being coupled between a said first voltage source and output, said control electrodes of said fourth and fifth transistors being coupled together.

7. The circuit of claim 6 wherein said current mirror further comprises sixth and seventh transistors, each having a control electrode and a path of controllable conductivity, said fifth and seventh transistor paths of controllable conductivity being coupled in series between said current source and said first voltage source,
   a fourth resistance,
   said path of controllable conductivity of said sixth transistor being coupled in series with said fourth resistance between said output and said second voltage source,
   said control electrode of said sixth and seventh transistor being coupled to said fourth resistance.

8. The circuit of claim 7 wherein said control electrodes of said fourth and fifth transistors are coupled to said current source.

9. In an integrated circuit, a circuit for driving a high capacitance load comprising a constant current source coupled to receive a source of operating voltage (VCC), comprising:
   first and second similarly constructed transistors each having a path of controllable conductivity and a control electrode;
   first and second nodes coupled respectively to the control electrodes of said second and first transistors;
   first and second resistances;
   said first node, said path of controllable conductivity of said first transistor, and said first resistance being coupled between the source of operating voltage and a reference potential;
   said second node, said path of controllable conductivity of said second transistor, and said second resistance being coupled to the reference potential and to an output of said current source;
   a third transistor and a third resistance, said third transistor having a path of controllable conductivity coupled between the source of operating voltage and said control electrode of said first transistor, said third resistance being coupled between said second node and said control electrode of said first transistor.

10. The circuit of claim 9 wherein said third transistor has a control electrode coupled to said reference potential.

11. The circuit of claim 9 wherein said first, second and third transistors are field effect transistors.

12. The circuit of claim 11 wherein said first and second field effect transistors are n-channel field effect transistors.

13. The circuit of claim 11 wherein said third transistor is a p-channel field effect transistor.

14. The circuit of claim 11 wherein said first and second field effect transistors are p-channel field effect transistors.

15. In an integrated circuit, a constant current supply circuit coupled to first and second voltage sources, and comprising:
   first and second transistors each having a path of controllable conductivity and a control electrode;
   first and second nodes each coupled to the control electrodes of said second and first transistors respectively;
   an output node;
   first and second resistances;
   said first node, first transistor, and first resistance being coupled between said first and second voltage sources;
   said second node, second transistor, and second resistance being coupled between said output node and one of said first and second voltage sources; and
   a compensation circuit comprising a third transistor and a third resistance, said third transistor having a path of controllable conductivity coupled between said control electrode of said first transistor and one of said first and second voltage sources, said third resistance being coupled between said second node and said control electrode of said first transistor, so that increased conduction of said third transistor forces said second transistor to supply less current to said output node.

16. The circuit of claim 15 wherein said path of controllable conductivity of said first transistor is coupled between said first node and said first voltage source.

17. The circuit of claim 16 wherein said path of controllable conductivity of said second transistor is coupled between said output node and said second node.

18. The circuit of claim 17 wherein said first resistance is coupled between said first node and one of said first and second voltage sources, and wherein said second resistance is coupled between said second node and one of said first and second voltage sources.

19. The circuit of claim 18 wherein:
   said first voltage source comprises a source of operating voltage;
   said second voltage source comprises a source of a reference voltage;
   said first transistor comprises a p-channel field effect transistor having its source/drain electrodes coupled in series between said source of operating voltage and said first node;
   said first resistance is coupled between said first node and said source of operating voltage;
   said second transistor comprises a p-channel field effect transistor having its source/drain electrodes coupled in series between said second node and said output node; and
   said second resistance is coupled between said source of operating voltage and said second node.

20. The circuit of claim 18 wherein:
   said first voltage source comprises a source of operating voltage;
   said second voltage source comprises a source of a reference voltage;
   said first transistor comprises an n-channel field effect transistor having its source/drain electrodes coupled in series between said source of reference voltage and said first node;
   said first resistance is coupled between said first node and said source of operating voltage;
   said second transistor comprises an n-channel field effect transistor having its source/drain electrodes coupled in series between said second node and said output node; and
   said second resistance is coupled between said source of reference voltage and said second node.

21. The circuit of claim 20 wherein said third transistor is a p-channel field effect transistor having its source/drain electrodes coupled between said control electrode of said first transistor and said source of operating voltage.

22. The circuit of claim 21 wherein said third transistor has a control electrode coupled to the source of reference voltage.

23. In an integrated circuit, a method of driving a high capacitance load comprising:
   generating a constant current by:
   providing first and second similar paths of controllable conductivity, each path including a respective resistance element, a node, and a control electrode;
   coupling said first path of controllable conductivity between a source of operating voltage and a reference potential;
   coupling said second path of controllable conductivity between the reference potential and an output of said current source;
   coupling the node of said first path to the control electrode of said second path and coupling the node of the second path to the control electrode of said first path; and modifying of the constant current to increase the current provide thereby when the supply voltage thereto decreases or the temperature increases, over normal operating voltages and temperatures of the integrated circuit by coupling a third path of controllable conductivity between the source of operating voltage and said first control electrode, and coupling a third resistance element between said second node and said first control electrode whereby the decrease in conduction of said third path of controllable conductivity forces said second path of controllable conductivity to supply more current to said output node.

24. The method of claim 23 wherein said method includes:

coupling said second node of the constant current source to the load via said second path of controllable conductivity; and coupling a separate current of said third path of controllable conductivity to said second node to modify the voltage at the node so that the current output is modified.

25. The method of claim 23 wherein the step of modifying further includes decreasing the current provided thereby when the supply voltage thereto increases or the temperature decreases, over normal operating voltages and temperatures of the integrated circuit whereby the increase in conduction of said third transistor forces said second transistor to supply less current to said output node.

26. An integrated circuit constant current source circuit comprising:

first and second field effect transistors, both having the same channel type, the gate electrode of each of said transistors being coupled to a source/drain electrode of the other one of said transistors;

a first resistance coupled between the gate electrode of said second transistor and a voltage source;

a second resistance coupled between the gate electrode of said first transistor and a different voltage source;

an output node coupled to a source/drain electrode of said second transistor; and said current source further comprising a p-channel transistor and a third resistance, the p-channel transistor being sized relatively smaller than said first and second transistors, the p-channel transistor having a first source/drain electrode coupled to the source of operating voltage, and having a second source/drain electrode coupled to the control electrode of the first transistor, said second source/drain electrode of said p-channel transistor being coupled also to said third resistance at one side thereof, the other side of said third resistance being coupled to a source/drain electrode of the second transistor.

27. The current source circuit of claim 26 wherein said first and second transistors are p-channel type, wherein said first transistor has a source/drain electrode coupled to said different voltage source, being a source of operating voltage, and wherein said second transistor has a source/drain electrode coupled to said source of operating voltage via said second resistance.

28. The current source circuit of claim 26 wherein said first and second transistors are n-channel type, wherein said first transistor has a first source/drain electrode coupled to said voltage source, being a reference potential and a second source/drain electrode coupled via said first resistance to said different voltage source, being a source of operating voltage, and wherein said second transistor has a source/drain electrode coupled via said second resistance to the reference voltage and the second transistor has one source/drain electrode coupled to said output node.

29. The circuit of claim 26, 27 or 28 wherein said voltage source comprises $V_{ss}$ and said different voltage source comprises $V_{cc}$.

30. A current mirror circuit for an integrated circuit comprising:

first and second voltage sources;

a current source;

an output;

first, second, third and fourth transistors each having a respective control electrode and a path of controllable conductivity, said first transistor being coupled between said current source and said first voltage source, said second transistor being coupled between said first voltage source and said output, said control electrodes of said first and second transistors being coupled together;

said first and fourth transistor paths of controllable conductivity being coupled in series between said current source and said first voltage source, a first resistance, said path of controllable conductivity of said third transistor being coupled in series with said first resistance between said output and said second voltage source, said control electrode of said third and fourth transistor being coupled to said first resistance.

31. The circuit of claim 30 wherein said control electrodes of said first and second transistors are coupled to said current source.

32. The circuit of claim 30 wherein said control electrodes of said third and fourth transistors are coupled to said first resistance.

* * * * *

UNITED STATES PATENT AND TRADEMARK OFFICE
CERTIFICATE OF CORRECTION

| | | |
|---|---|---|
| PATENT NO. | : 5,134,310 | |
| APPLICATION NO. | : 07/644903 | |
| DATED | : July 28, 1992 | |
| INVENTOR(S) | : Kenneth J. Mobley et al. | |

It is certified that error appears in the above-identified patent and that said Letters Patent is hereby corrected as shown below:

In the claims:

Claim 1, col. 6, line 29, please delete "resistances" and substitute therefore --resistance--.

Claim 3, col. 6, line 38, please delete "said" and substitute therefore --a--.

Claim 7, col. 6, line 65, please delete "electrode" and substitute therefore --electrodes--.

Claim 7, col. 6, lines 65-66, please delete "transistor" and substitute therefore --transistors--.

Claim 23, col. 9, line 3, please delete "of".

Claim 23, col. 9, line 4, please delete "provide" and substitute therefore --provided--.

Claim 23, col. 9, line 4, please delete "the" and substitute therefore --a--.

Claim 23, col. 9, line 5, please delete "the" and substitute therefore --a--.

Claim 23, col. 9, line 15, please delete "node".

Claim 25, col. 9, line 32, please delete "node".

UNITED STATES PATENT AND TRADEMARK OFFICE
CERTIFICATE OF CORRECTION

| | |
|---|---|
| PATENT NO. | : 5,134,310 |
| APPLICATION NO. | : 07/644903 |
| DATED | : July 28, 1992 |
| INVENTOR(S) | : Kenneth J. Mobley et al. |

It is certified that error appears in the above-identified patent and that said Letters Patent is hereby corrected as shown below:

Claim 26, col. 9, line 50, please delete "the" and substitute therefore --a--.

Claim 30, col. 10, line 46, please delete "electrode" and substitute therefore --electrodes--.

Claim 30, col. 10, lines 46-47, please delete "transistor" and substitute therefore --transistors--.

Signed and Sealed this

Thirty-first Day of March, 2009

JOHN DOLL
*Acting Director of the United States Patent and Trademark Office*